(12) United States Patent
Yeh et al.

(10) Patent No.: US 10,163,698 B2
(45) Date of Patent: Dec. 25, 2018

(54) INTERCONNECT STRUCTURE AND MANUFACTURING METHOD THEREOF

(71) Applicant: TAIWAN SEMICONDUCTOR MANUFACTURING COMPANY LTD., Hsinchu (TW)

(72) Inventors: Ching-Fu Yeh, Hsinchu (TW); Ming-Han Lee, Taipei (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/271,726

(22) Filed: May 7, 2014

(65) Prior Publication Data

US 2015/0325522 A1 Nov. 12, 2015

(51) Int. Cl.
| | |
|---|---|
| *H01L 21/768* | (2006.01) |
| *H01L 23/532* | (2006.01) |
| *H01L 23/528* | (2006.01) |
| *H01L 21/321* | (2006.01) |
| *H01L 21/3213* | (2006.01) |
| *H01L 21/285* | (2006.01) |
| *C23C 14/04* | (2006.01) |
| *C23C 14/34* | (2006.01) |
| *C23C 14/58* | (2006.01) |
| *H01L 23/522* | (2006.01) |

(52) U.S. Cl.
CPC ...... *H01L 21/76882* (2013.01); *C23C 14/046* (2013.01); *C23C 14/345* (2013.01); *C23C 14/5826* (2013.01); *H01L 21/2855* (2013.01); *H01L 21/321* (2013.01); *H01L 21/3212* (2013.01); *H01L 21/32136* (2013.01); *H01L 21/76807* (2013.01); *H01L 21/76877* (2013.01); *H01L 21/76879* (2013.01); *H01L 21/76883* (2013.01); *H01L 23/528* (2013.01); *H01L 23/53228* (2013.01); *H01L 21/76873* (2013.01); *H01L 23/5226* (2013.01); *H01L 23/53233* (2013.01); *H01L 23/53238* (2013.01); *H01L 2924/0002* (2013.01)

(58) Field of Classification Search
CPC .................................................. H01L 21/76873
USPC ........................................................ 438/618
See application file for complete search history.

(56) References Cited

U.S. PATENT DOCUMENTS

| | | | | |
|---|---|---|---|---|
| 6,391,776 | B2 * | 5/2002 | Hashim | H01L 21/2855 257/E21.169 |
| 2003/0034244 | A1 * | 2/2003 | Yasar | C23C 14/046 204/192.3 |
| 2009/0236744 | A1 * | 9/2009 | Kinoshita | H01L 21/2855 257/751 |

* cited by examiner

*Primary Examiner* — Hsin-Yi Hsieh
(74) *Attorney, Agent, or Firm* — WPAT, P.C., Intellectual Property Attorneys; Anthony King

(57) ABSTRACT

A method for manufacturing a semiconductor comprises: providing a substrate; forming an opening in a dielectric layer disposed over the substrate; providing a target with a first type atoms; ionizing the first type atoms provided from the target; providing a bias to the substrate for controlling the moving paths of the ionized first type atoms thereby directing the ionized first type atoms in the opening; and forming a first conductive structure from bottom of the opening with the ionized first type atoms under a pre-determined frequency and a pre-determined pressure.

20 Claims, 11 Drawing Sheets

INTERCONNECT STRUCTURE AND MANUFACTURING METHOD THEREOF

FIELD

The present disclosure relates to an interconnect structure and method for manufacturing thereof.

BACKGROUND

Modern semiconductor packages are formed from multiple stacked material layers that may include numerous active devices electrically coupled together by conductive metal interconnects and lines. High speed semiconductor devices can be formed using a combination of copper interconnects with suitable dielectric materials or films such as low-k dielectrics to take advantage of the superior conductivity of copper and reduced parasitic capacitance between the conductors.

Back end-of-line ("BEOL") fabrication processes are used to create an intricate network of conductive interconnects in each layer and between the multiple layers. An additive patterning process referred to as "dual damascene" is one BEOL process used to form patterned copper conductor circuits in chip packages which interconnect various active components (e.g., resistors, transistors, etc.) disposed in single and multiple layers throughout the chip. Some of these interconnect circuit structures include within-layer trenches or lines filled with the copper to form circuits within a layer and between-layer vias which are essentially metal-plated or filled holes that electrically connect circuits between devices in the multiple layers of the semiconductor package.

As semiconductor technology pushes to 10 nanometers (N10) and below scale, a physical vapor deposition (PVD) seed and electrochemical plating (ECP) Cu deposition have serious overhangs during metal deposition operations. The severe overhangs seriously decrease continuous sidewall coverage and induce inside voids due to pinch-off. Therefore, a solution to improve the gap-filling in a small size damascene structure is sought.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
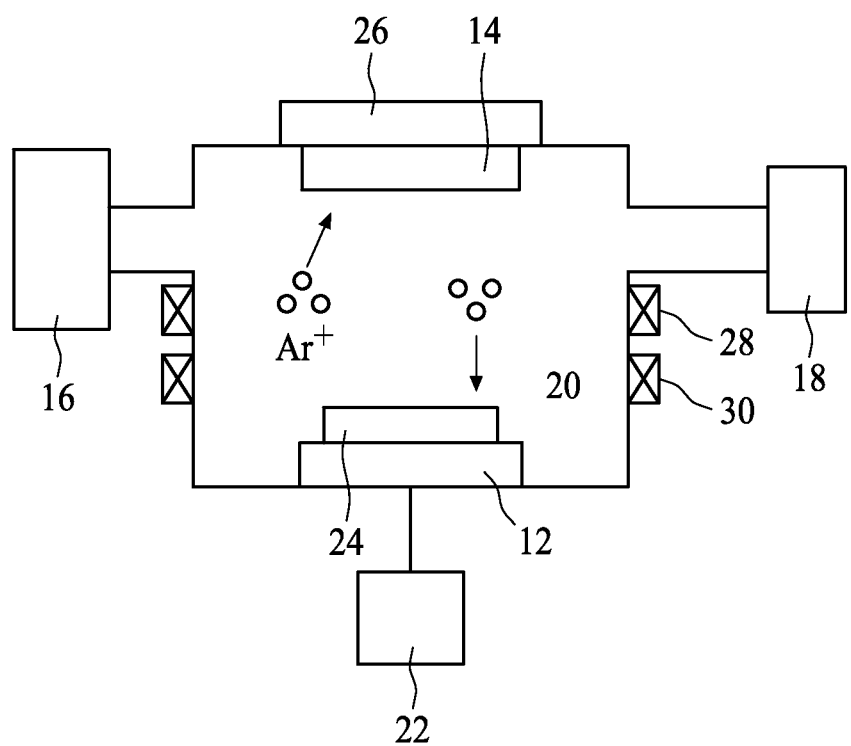
FIG. 1 is a magnetic-controlled reactive sputter tool according to some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some exemplary metal formation operations are disclosed below. The exemplary metal formation operations include a step for forming a conductive structure with ionized atoms under a pre-determined frequency and a pre-determined pressure. In some embodiments, the exemplary metal formation operations further include a step for forming a conductive structure under a predetermined heating condition. During the exemplary metal formation operations, openings of a damascene structure or a dual damascene structure are filled with the conductive structure from the bottom of the openings. The exemplary metal formation operations are suitable for forming conductive interconnects of a semiconductor device below the 20 nanometers (N20) technology node, especially below N10. Voids inside the conductive structures that are induced during conventional physical vapor deposition (PVD) seed and electrochemical plating (ECP) Cu deposition are avoided. When the feature of the semiconductor device shrinks strictly, the above metal formation operations not only advantageously provide excellent gap-filling ability but also produce the conductive interconnects with low electrical resistance grains. In some embodiments, the conductive structure formed with the exemplary metal formation operations also possesses bamboo structures.

Referring to FIG. 1, a magnetic-controlled reactive sputter tool 10 is introduced. The sputter tool 10 has a chamber 20 configured as a space for manufacturing a semiconductor wafer. A pedestal 12 is located on one side of the chamber 20 and a target 14 is disposed on a side opposite to the pedestal 12. In some embodiments, the target 14 is facing the pedestal 12 but separated with a predetermined distance. A gas supply 16 is connected to an inlet of the chamber 20. However, the chamber 20 may be connected with more than one gas supply if needed. A pump 18 is connected to the chamber 20 on one side in order to provide a high vacuum environment for the chamber 20. There may be a foreline further connected to the pump 18 at downstream to vent gas from the chamber 20 into abatement. A wafer 24 is provided on the pedestal 12. A bias power 22 is coupled to the pedestal 12 for providing a substrate bias to the pedestal for biasing the wafer 24 to attract the deposition material ions from the target 14. In some embodiments, the target 14 is negatively biased by a variable DC power source (which is not shown in FIG. 1) at a DC power. When the variable DC power source biases the target 14, the plasma is ignited and further maintained.

Gas, such as Ar or Ne, is introduced from the gas supply 16 and delivered into the chamber 20 and an electric field is applied on the gas to generate ionization collision. The ionized gas atoms (like $Ar^+$) are guided to bombard the target 14 and dislodge atoms from the target 14. In order to increase the bombardment efficiency, a magnetron 26 is optionally adopted to generate a magnetic field near the target 14 so as to increase the density of ionized gas atoms. The magnetron 26 is located proximal to the ceiling of the chamber 20 and may be disposed on an external surface of the chamber 20 as shown in FIG. 1. In some embodiments, the target 14 is made of metal such as Cu, Al, etc. The metal atoms dislodged from the target 14 by the ionized gas atoms fall down and move toward the wafer 24. Ionizers 28 and 30 are disposed between the target 14 and the pedestal 12 to affect the magnetic field and hence affecting plasma density and ion flux. In some embodiments, the ionizers 28 and 30 are coils 28 and 30 surrounding the chamber 20 and locate between the target 14 and the pedestal 12 such that the coils 28 and 30 may facilitate to ionize the falling metal atoms before the metal atoms reach the wafer 24. The coils 28 and 30 may be respectively powered by separate sources. The plasma created by the coils 28 and 30 ionizes a substantial portion (for example, over 80%) of the sputtered metal atoms falling from the target 12. The sputtered metal atoms are ionized under a predetermined frequency and a predetermined pressure. In some embodiments, the sputtered metal atoms are ionized under a frequency between about 30 MHz and about 70 MHz, and a pressure between about 50 mTorr and about 100 mTorr. The settings of the predetermined frequency and pressure further increase the collision possibility to induce high ion density plasma. The ionized metal atoms are directed to the wafer 24 by the bias power 22. This directed flux of ionized metal atoms is to ensure that the metal species reach the bottom of deep vias or openings. Under the predetermined frequency and pressure, the ionized atoms are controlled by the substrate bias to achieve high directional control.

In the present disclosure, the sputter tool 10 illustrated in FIG. 1 is utilized to perform various metal formation operations on a semiconductor device or wafer. Some of the metal formation operations are designed for ultra-small technology node semiconductor devices, such as, sub 20 nm or 10 nm. The technology node is referred to the smallest gate dimension in the semiconductor device. In some embodiments, the smallest gate dimension is also called critical dimension (CD) of gate length. For the ultra-small technology node semiconductor devices, a metallization feature known as damascene is widely used to form conductive interconnects above the gate. A portion of dielectric is carved out to form recessed features such as vias, openings, or trenches for metal to fill in. As geometry (diameter or width) of the recessed feature shrinks below certain degree, say under 30 nm, the directional metal formation operations can fill metal in the recessed feature in bottom-up manner without pinch-off.

An exemplary method for forming a semiconductor device with single damascene structures by using the sputter tool 10 is illustrated in FIGS. 2A-2E, which shows sequential cross-sectional side views at different stages of fabrication.

Figure 2A:
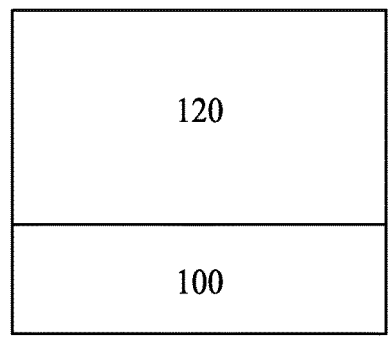
FIG. 2A to FIG. 2E are an exemplary method for forming a semiconductor device with single damascene structures by using a sputter tool according to the present disclosure.

Referring to FIG. 2A, a method for forming a semiconductor device comprises providing a substrate 100 and forming a dielectric layer 120 on the substrate. In the substrate 100, some features are omitted for simplification. For example, the substrate 100 may include CMOS transistors or other electric components such as resistor, diode etc. Each CMOS transistor may have several doped regions and a gate. In some embodiments, the gate is a metal gate (or replacement gate) with a gate length smaller than about 20 nm or about 10 nm. The substrate 100 also includes several materials such as silicon, GaAs, germanium, silicon on insulator (SOI) or other suitable semiconductive materials. The dielectric layer 120 can be formed in various processes, such as chemical vapor deposition (CVD) or spin-coating. The dielectric layer 120 covers on the substrate 100 and provides electrical isolation between the substrate 100 and overlaid conductive features. The dielectric layer 120 includes dielectric materials such as silicon oxide (SiO), silicon nitride (SiN), organosilicate glass (OSG), SiCOH, a spin-on low-k dielectric material such as SiLK™, etc. The dielectric layer 120 may be porous or non-porous material.

Figure 2B:
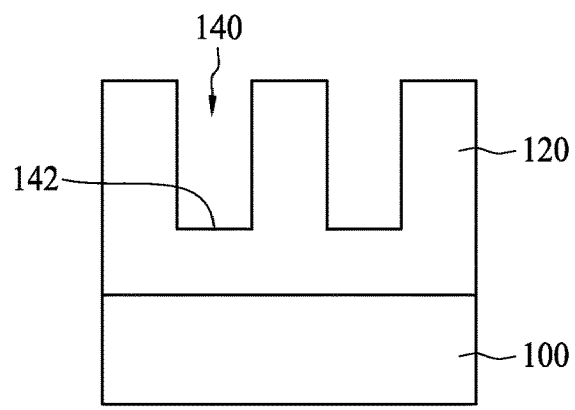

Referring to FIG. 2B, a single damascene operation comprises forming openings 140 by performing photolithography and etching operations on the dielectric layer 120. After implementing the etching operations to the dielectric layer 120, the openings 140 are formed. The etched dielectric layer 120 with the openings 140 is configured for a single damascene structure. In various embodiments, etching operations may be accomplished by selection of etching gas chemistries, materials with different etch selectivity, etching operation depth control by utilizing an etching equipment, or a combination thereof. Suitable etching gases may include HBr, Cl2, CH4, CHF3, CH2F2, CF4, Ar, H2, N2, and others, but not limited.

Figure 2C:
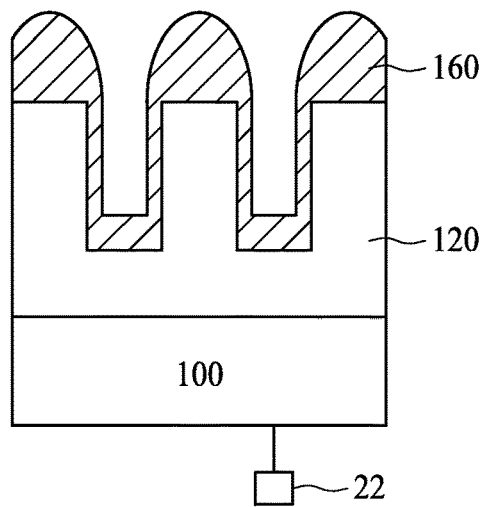

Referring to FIG. 2C, a conductive structure 160 is formed on the single damascene structure 120 by using a sputtering deposition. The conductive structure 160 may be a Cu structure or a noble metal structure. For example, during the sputtering deposition, a Cu target may be provided for the sputtering deposition, and thus the conductive structure 160 is made of Cu. In some embodiments, a second target with a second material (e.g. a noble metal) which is different from Cu may be provided and that the conductive structure 160 is made of the alloy of Cu and the second material. The Cu atoms provided from the Cu target are ionized under a predetermined frequency and pressure in a system like sputter tool 10. In some embodiments, the predetermined frequency is from about 30 MHz to about 70 MHz, and the predetermined pressure is from about 50 mTorr to about 100 mTorr. Such kind of high frequency increases ion collision possibility and such kind of high pressure decreases mean free path of the ionized Cu atoms. Under the circumstance, high ion density of the ionized atoms is achieved. The ionized ratio of the Cu atoms is able to be more than 80%. In some embodiments, the ionized ratio of the Cu atoms may be more than 99%. A substrate bias is provided from a bias supply/bias source 22 to the substrate 100 for directing the ionized Cu atoms. The substrate bias provided by the bias supply 22 is from about 0V to about 300V. The deposition direction of the ionized Cu atoms is controlled by the substrate bias such that the conductive structure 160 may be formed from the bottom 142 of the openings 140. A high directional bottom-up deposition may be arrived at such that potential voids are avoided. In some embodiments, the conductive structure 160 with a thickness from about 200 angstroms (A) to about 600 A may be formed from the bottom of the openings 140 without voids when the gate CD shrinks below N20.

In some embodiments, a diffusion barrier layer (not shown) may be formed in the openings 140 and disposed between the single damascene structure 120 and the conductive structure 160. The diffusion barrier layer is formed on the side walls of the single damascene structure 120 prior to the formation of the conductive structure 160. The diffusion barrier layer may prevent diffusion of contaminants from and/or into an opening like trench/via and may promote adhesion of the conductive structure 160 to the single damascene structure 120. The diffusion barrier layer may include Ta, TaN, W, WN, Ti, TiN, Ru, Mn, MnN, MoN, OsN, or a stack thereof such as Ta/TaN, Ta/TaN/Ta, TaN/Ta, etc. The diffusion barrier layer typically has a thickness from about 20 A to about 500 A and is formed by conventional chemical vapor deposition (CVD), plasma enhanced chemical vapor deposition (PECVD), low pressure chemical vapor deposition (LPCVD), high density plasma chemical vapor deposition (HDP-CVD) or atomic layer deposition (ALD), etc. The diffusion barrier layer may be also applied to a dual damascene structure.

Figure 2D:
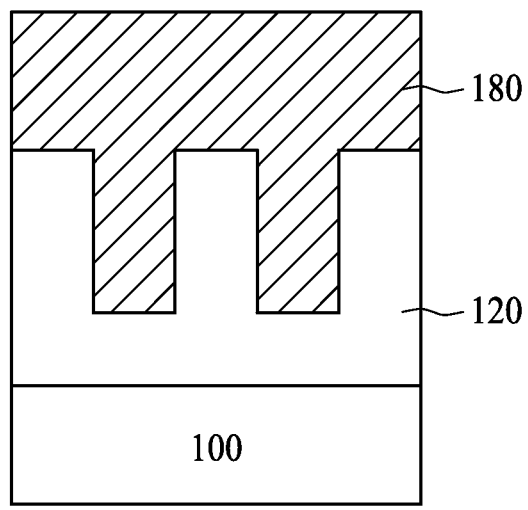

Referring to FIG. 2D, a fill-in operation is performed on the conductive structure 160 and a second conductive structure 180 is formed on the conductive structure 160 in order to fill the openings 140. The fill-in operation can be performed either by the same Cu deposition adopted in FIG. 2C or by an ECP deposition. The second conductive structure may include Cu or Cu alloy.

Figure 2E:
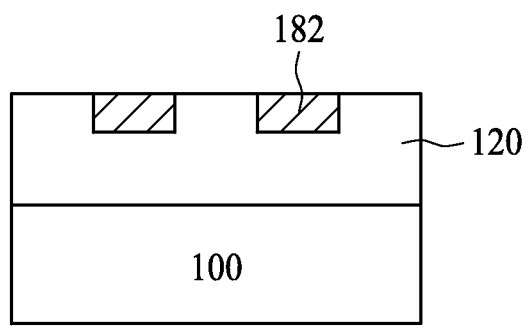

Referring to FIG. 2E, some portions of the second conductive structure 180 and some portions of the single damascene structure 120 are removed by using a CMP operation. After implementation of the removing operation, interconnects 182 are formed in the single damascene structure. In some embodiments, multi-CMP operations may be combined. For example, overburden portions of the second conductive structure 180 are removed by a first-stage CMP operation, and then, the residual portions of second conductive structure 180 and some portions of the single damascene structure 120 are removed by a second-stage CMP operation. The interconnects 182 are formed after the remove operations. In an embodiment, the interconnects 182 may be a set of metal lines in one dielectric layer. In an embodiment, the interconnects 182 may be a set of metal lines between multiple dielectric layers.

An exemplary method for forming a semiconductor device with dual damascene structures by using the sputter tool 10 is illustrated in FIGS. 3A-3H, which shows sequential cross-sectional side views at different stages of fabrication. Technical features with a same or similar numeral are not repeated here for simplification.

Figure 3A:
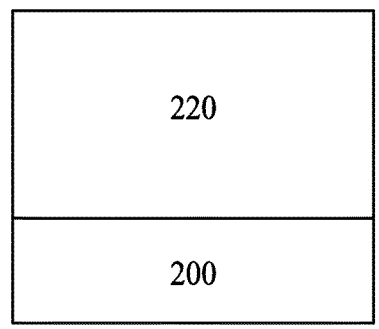
FIG. 3A to FIG. 3H are an exemplary method for forming a semiconductor device with dual damascene structures by using a sputter tool according to the present disclosure.

Referring to FIG. 3A, a method for forming a semiconductor device comprises providing a substrate 200 and forming a dielectric layer 220 on the substrate in the similar manner as disclosed in FIG. 2A.

Figure 3B:
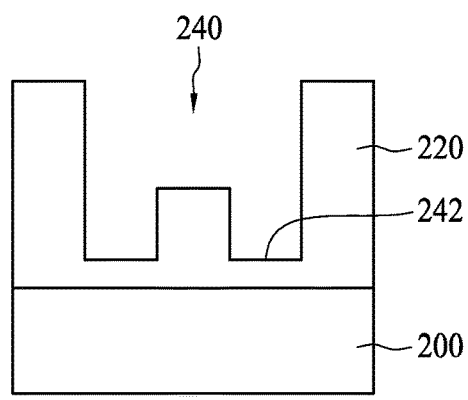

Referring to FIG. 3B, a dual damascene operation comprises forming openings 240 by performing photolithography and etching operations on the dielectric layer 220. In an exemplary embodiment, deep via first then trench operation is introduced. A deep via is firstly formed by performing a first set of photolithography and etching operations. After the formation of the deep via, a trench is formed by performing a second set of photolithography and etching operations. In another embodiment, trench first then deep via operation is introduced. A trench is firstly formed by performing a first set of photolithography and etching operations. After the formation of the trench, a deep via is formed by performing a second set of photolithography and etching operations. The etched dielectric layer 220 with an opening 240 is configured for a dual damascene structure. In an exemplary embodiment, the etched dielectric layer 220 may have multiple openings 240.

Figure 3C:
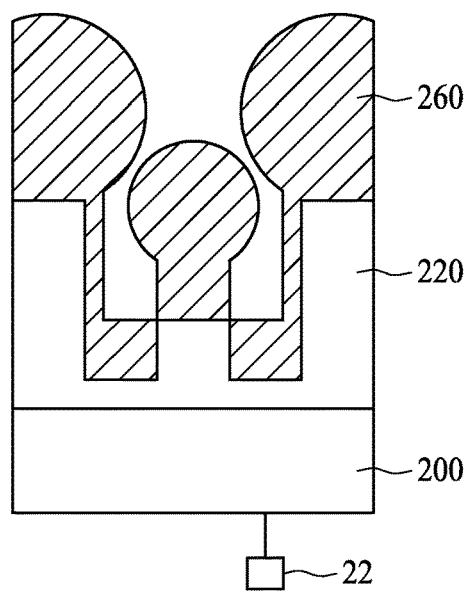

Referring to FIG. 3C, a first conductive structure 260 is formed on the dual damascene structure 220 by a sputtering deposition during a first predetermined deposition time. The first conductive structure 260 may be made of Cu. The first predetermined deposition time may be set according to different parameters under different operations. In an exemplary embodiment, a Cu target is provided for the sputtering deposition. The Cu atoms provided from the Cu target are ionized under a predetermined frequency and pressure in a system like sputter tool 10. In some embodiments, the predetermined frequency is from about 30 MHz to about 70 MHz, and the predetermined pressure is from about 50 mTorr to about 100 mTorr. High ion density of the ionized atoms is thereby arrived at. The ionized ratio of the Cu atoms is able to be more than 80%. In some embodiments, the ionized ratio of the Cu atoms may be more than 99%. The substrate 200 is biased by a bias supply/bias source 22 for guarding the ionized Cu atoms. The substrate bias provided by the bias supply/bias source 22 may be from about 0 V to about 300 V. The deposition direction of the ionized Cu atoms is controlled by the substrate bias such that the first conductive structure 260 may be formed from the bottom 242 of the opening 240. A high directional bottom-up deposition is arrived at. In some embodiments, the first conductive structure 260 with a thickness from about 200 angstroms (A) to 600 A may be formed from the bottom 242 of the opening 240 when the gate CD shrinks below N20. Some top portions of the first conductive structure 260 are presented like mushroom, or called overhangs. The overhangs of the first conductive structure 260 almost go to pinch-off.

Figure 3D:
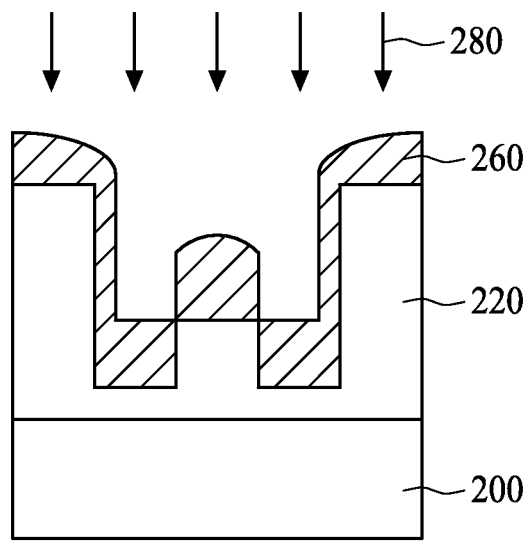

The overhangs of the first conductive structure 260 are trimmed prior to a proceeding fill-in operation as in FIG. 3D. In some embodiments, the overhangs are trimmed by a plasma treatment and the overhangs of the first conductive structure 260 are etched by plasma 280. After the plasma treatment, the overhangs of the first conductive structure 260 are removed to eliminate pinch-off, and therefore an in-film void in the first conductive structure 260 is avoided. In an embodiment, the plasma treatment for Cu etch may be performed with ion bombardments. In some embodiments, the plasma treatment for Cu etch may include but not limited to hydrogen-based plasma etch, Ar plasma etch, He plasma etch, $N_2$ plasma etch, $BCl_3$ plasma etch, $Cl_2$ plasma etch, or CH4-based plasma etch etc. In some embodiments, the substrate bias is from about 25 W to about 200 W, the pressure is from about 10 mTorr to about 100 mTorr and the temperature is from about 10° C. to about 100° C. during the plasma treatment. The plasma treatment applies for etching fields and overhangs of the first conductive structure 260. The plasma treatment eliminates the pinch-off phenomena and provides excellent bottom coverage for the dual damascene structure 220.

Figure 3E:
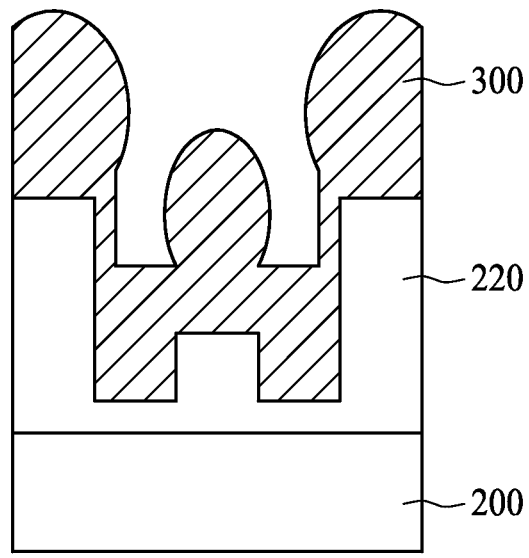
Figure 3F:
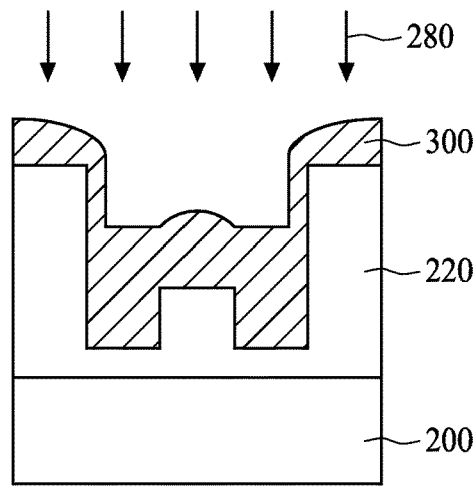

Referring to FIG. 3E, a sputtering deposition is performed during a second predetermined deposition time. After the sputtering deposition, a second conductive structure 300 is formed. The sputtering deposition may be either the same or different sputtering deposition performed in FIG. 3C. The second predetermined deposition time may be either the same as or different from the first predetermined deposition time. That is, the parameters of the sputtering deposition may be particularly set for the need of the second conductive structure 300. Some overhangs of the second conductive structure 300 may be formed during the current sputtering deposition.

A plasma treatment similar to FIG. 3D is optionally adopted according to the morphology of second conductive structure 300. If the second conductive structure 300 has some overhangs with a potential to cause pinch-off, a plasma treatment 280 is introduced to trim the overhangs as in FIG. 3F. However, if the overhangs are deemed not harmful, the plasma treatment 280 can be skipped. Operations shown in FIGS. 3E and 3F can be repeated several times according to different needs and technology settings.

Figure 3G:
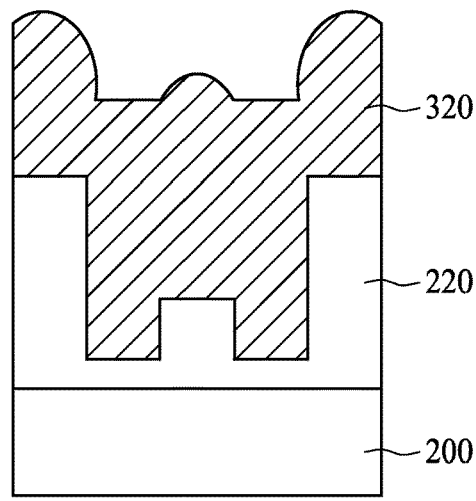

Referring to FIG. 3G, a third conductive structure 320 is formed either by the same Cu deposition adopted in FIG. 3C or by an ECP deposition.

Figure 3H:
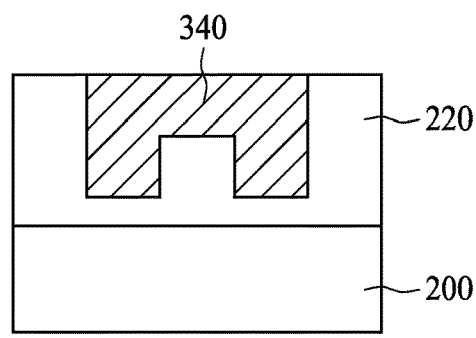

Referring to FIG. 3H, some portions of the third conductive structure 320 and a portion of the dual damascene structure 220 are removed by using a CMP operation. After implementation of the removing operation, an interconnect 340 is formed in the dual damascene structure. In some embodiments, multi-CMP operations may be introduced. For example, overburden portions of the third conductive structure 320 are removed by a first-stage CMP operation, and then, the residual portions of third conductive structure 320 and some portions of the dual damascene structure 220 are removed by a second-stage CMP operation. The interconnect 340 is formed after the remove operations. In an embodiment, the interconnect 340 is a set of metal lines in one dielectric layer. In an embodiment, the interconnect 340 is a set of metal lines between multiple dielectric layers.

As shown in FIGS. 3A-3F, a gap-fill challenge of severe overhangs with continuous sidewall coverage of the dual damascene structure 220 is overcome when the gate CD shrinks below N10.

An exemplary method for forming a semiconductor device with single damascene structures by using a reflow operation is illustrated in FIGS. 4A-4F, which shows sequential cross-sectional side views at different stages of fabrication.

Figure 4A:
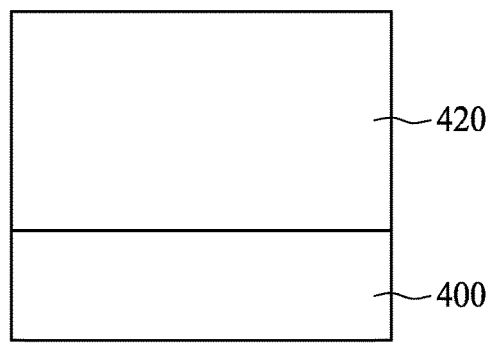
FIG. 4A to FIG. 4F are an exemplary method for forming a semiconductor device with single damascene structures by using a reflow operation according to the present disclosure.

Referring to FIG. 4A, a method for forming a semiconductor device comprises providing a substrate 400 and forming a dielectric layer 420 on the substrate in the similar manner as disclosed in FIG. 2A.

Figure 4B:
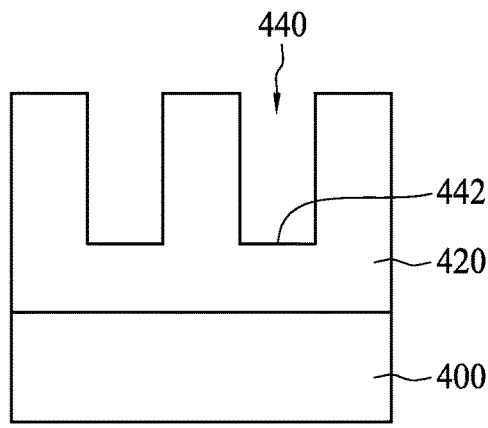

Referring to FIG. 4B, a single damascene operation comprises forming openings 440 by performing photolithography and etching operations on the dielectric layer 420. After implementing the etching operations to the dielectric layer 420, the openings 440 are formed. The etched dielectric layer 420 is a single damascene structure.

Figure 4C:
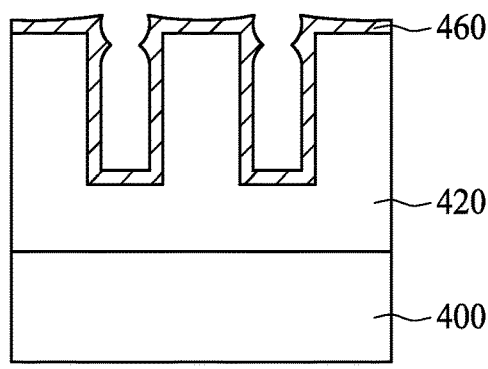

Referring to FIG. 4C, a first conductive structure 460 is deposited on the etched dielectric layer 420. The deposition operations mentioned in aforementioned embodiments are optionally adopted. In other words, the first conductive structure 460 can be formed in the openings 440 in a boom-up manner for some embodiments. A thermal heating treatment is implemented concurrently with the deposition of the first conductive structure 460. The time for the thermal heating treatment is from about 30 seconds to about 300 seconds. The thermal temperature is from about 200° C. to about 400° C. The first conductive structure 460 may be formed by Cu. In an embodiment, the first conductive structure 460 is made of Cu alloy or a noble metal. In some embodiments, the heating treatment may be a thermal annealing operation or a heater baking operation. In an embodiment, the metal deposition and the thermal annealing treatment may be implemented concurrently, wherein the thermal temperature is from about 200° C. to about 400° C. and the thermal duration is from about 30 seconds to about 300 seconds. In an alternative embodiment, an in-situ metal deposition may be implemented with a hot heater under a predetermined temperature from about 200° C. to about 400° C.

Figure 4D:
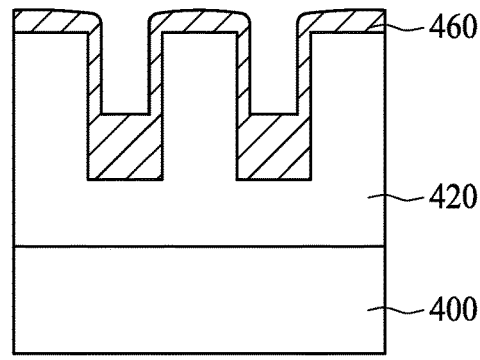

The thermal heating treatment helps to smoothen top surface of the metal deposition. Referring to FIG. 4D, the surface and the corners of the first conductive structure 460 heated by the thermal heating treatment become smoother than the original surface and original corners of the first conductive structure 460 as in FIG. 4C. The thermal heating treatment increases the mobility of the Cu ions/atoms and makes the Cu ions/atoms reflow. Under the thermal heating treatment, the Cu metal is thereby moving into the bottom 442 of the etched dielectric layer 420 for lowest free energy during the metal deposition. The above treatments make the Cu ions/atoms reflow to the bottom 442 of the damascene structure smoothly.

Figure 4E:
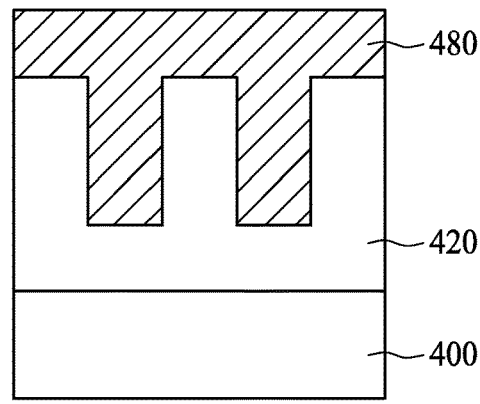

Referring to FIG. 4E, a second conductive structure 480 is formed by the same or different Cu deposition adopted in FIG. 4C or by an ECP deposition.

Figure 4F:
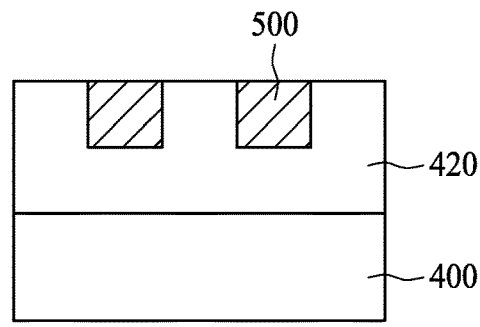

Referring to FIG. 4F, some portions of the second conductive structure 480 and some portions of the etched dielectric layer 420 are removed by using a CMP operation. After implementation of the removing operation, interconnects 500 are formed in the dual damascene structure. In some embodiments, multi-CMP operations may be introduced. For example, overburden portions of the second conductive structure 480 are removed by a first-stage CMP operation, and then, the residual portions of second conductive structure 480 and some portions of the etched dielectric layer 420 are removed by a second-stage CMP operation. The interconnects 500 are formed after the remove operations.

An exemplary method for forming a semiconductor device with dual damascene structures by using a sputter tool with a reflow operation is illustrated in FIGS. 5A-5G, which shows sequential cross-sectional side views at different stages of fabrication.

Figure 5A:
FIG. 5A to FIG. 5G are an exemplary method for forming a semiconductor device with dual damascene structures by using a sputter tool with a reflow operation according to the present disclosure.

Referring to FIG. 5A, a method for forming a semiconductor device comprises providing a substrate 600 and forming a dielectric layer 620 on the substrate in the similar manner as disclosed in FIG. 2A.

Figure 5B:
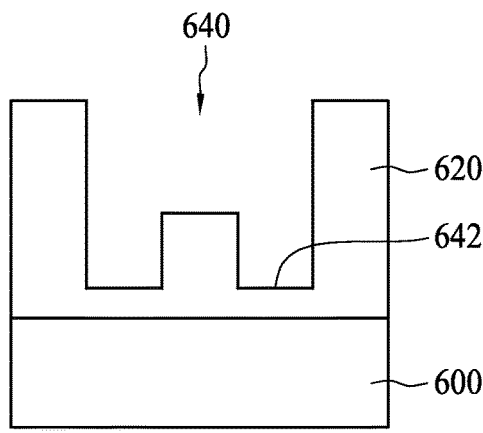

Referring to FIG. 5B, a dual damascene operation comprises forming an opening 640 by performing photolithography and etching operations on the dielectric layer 620. In an exemplary embodiment, the etched dielectric layer 620 may have multiple openings 640. The formation of the dual damascene structure is similar to that of FIG. 3B. The etched dielectric layer 620 with the opening 640 is a dual damascene structure.

Figure 5C:
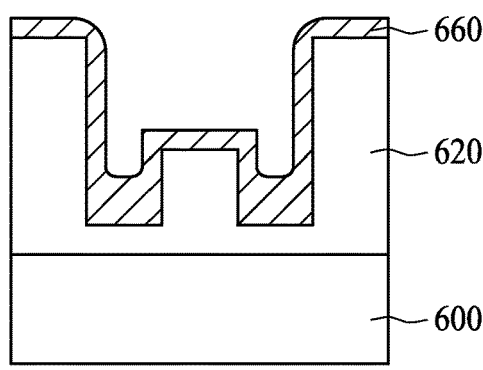

Referring to FIG. 5C, a metal deposition is performed on the etched dielectric layer 620. The deposition operations mentioned in aforementioned embodiments are optionally adopted. In other words, the first conductive structure 660 can be formed in the opening 640 in a boom-up manner for some embodiments. Similar to FIGS. 4C and 4D, a thermal heating treatment is implemented concurrently with the metal deposition to form a first conductive structure 660. The time for the thermal heating treatment is from about 30 seconds to about 300 seconds. The thermal temperature is from about 200° C. to about 400° C. In some exemplary embodiments, the metal deposition may be Cu deposition, Cu alloy deposition or noble metal deposition. In some embodiments, the first conductive structure 660 with a thickness around 200 to 600 angstroms (A) may be formed from the bottom 642 of the openings 640 when the gate CD shrinks below N20.

Figure 5D:
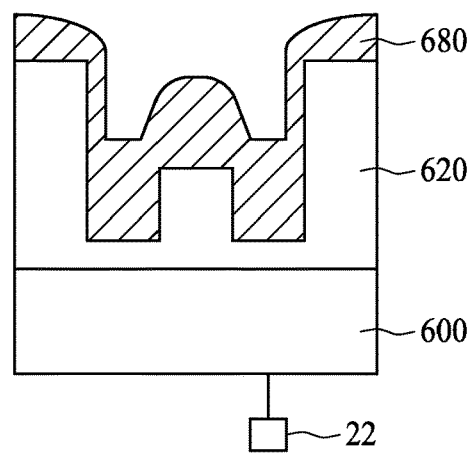

Referring to FIG. 5D, a sputtering deposition is performed on the first conductive structure 660 and a second conductive structure 680 is thereby formed. In an exemplary embodiment, a Cu target may be provided for the sputtering deposition. The Cu atoms provided from the Cu target are ionized under a predetermined frequency and pressure in a system like sputter tool 10. In some embodiments, the predetermined frequency is from about 30 MHz to about 70 MHz and the predetermined pressure is from about 50 mTorr to about 100 mTorr such that high ion density of the ionized atoms is arrived at. In an exemplary embodiment, a plasma treatment may be implemented for etching field and overhangs of the second conductive structure 680 to avoid pinch-off. The parameters for the plasma treatment may be similar to those recited in FIG. 3D.

Figure 5E:
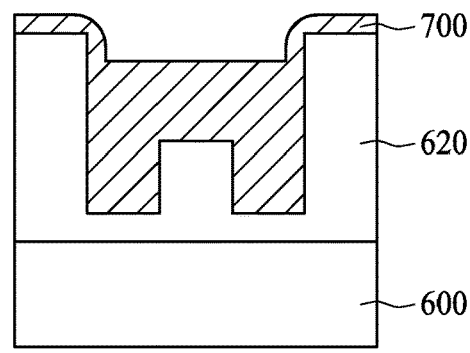

Referring to FIG. 5E, a reflow operation is further implemented to form a third conductive structure 700.

Figure 5F:
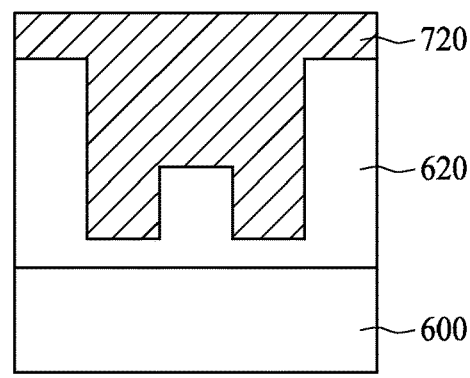

Referring to FIG. 5F, a fourth conductive structure 720 is formed either by the same Cu deposition adopted in FIG. 3C or by an ECP deposition.

Figure 5G:
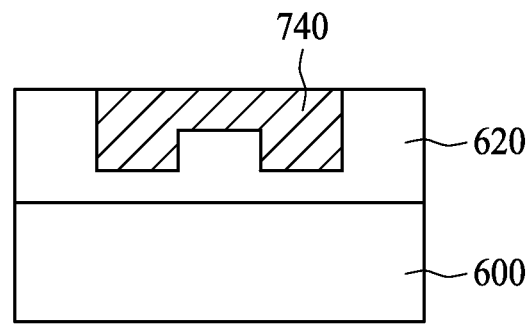

Referring to FIG. 5G, some portions of the fourth conductive structure 720 and some portions of the etched dielectric layer 620 are removed by using a CMP operation. After implementation of the removing operation, an interconnect 740 is formed in the dual damascene structure. In some embodiments, multi-CMP operations may be introduced. For example, overburden portions of the fourth conductive structure 720 are removed by a first-stage CMP operation, and then, the residual portions of fourth conductive structure 720 and some portions of the etched dielectric layer 620 are removed by a second-stage CMP operation. The interconnect 740 is formed after the remove operations.

Figure 6:
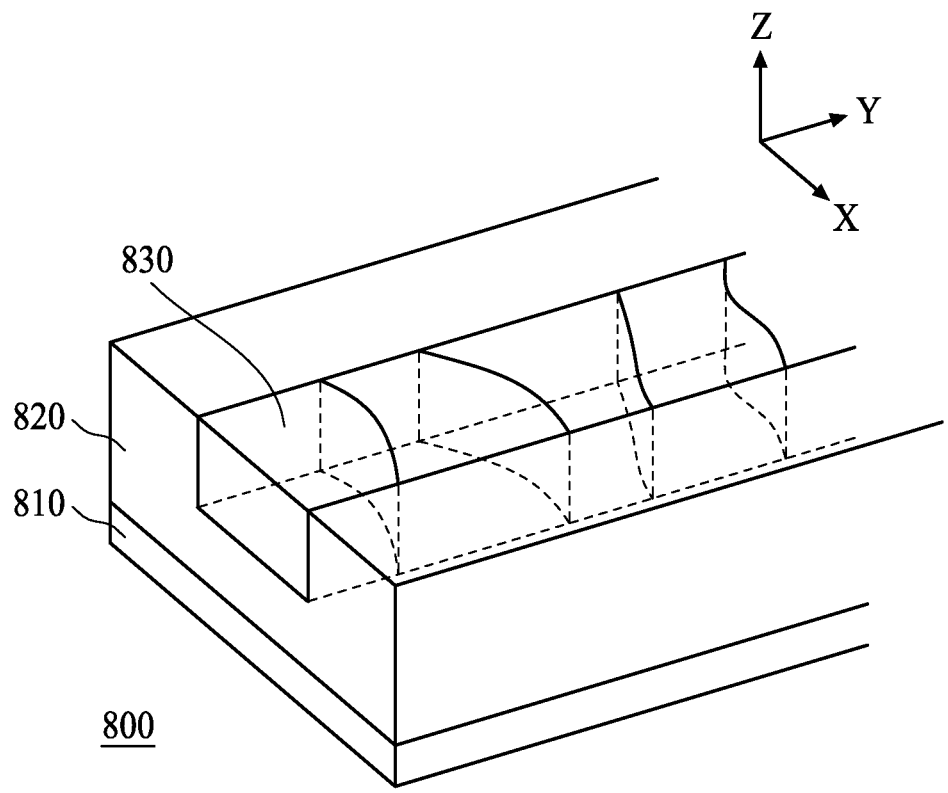
FIG. 6 is a perspective view of a semiconductor device with a damascene structure according to some embodiments of the present disclosure.

A perspective view of a semiconductor device 800 is illustrated in FIG. 6. The semiconductor device 800 has a damascene structure that is either a single damascene structure or a portion of a dual damascene structure. The semiconductor device 800 can be manufactured by any of aforementioned embodiments or combination thereof. A damascene structure 820 is formed on a substrate 810.

The semiconductor device has an interconnect. In an embodiment, the interconnect is a set of metal lines between multiple dielectric layers. In an embodiment, the interconnect is a set of metal lines in one dielectric layer. The interconnect includes a metal line 830 constructed with some metallic grains. The metal line extends along a direction Y with a traversal width measured substantially perpendicular to the direction Y. The traversal width extends along a direction X. As shown in FIG. 6, directions X, Y and Z are orthogonal to each other. In an exemplary embodiment, one metallic grain has some axes passing through its center. The lengths of the axes passing through the centers of 90% or more of the metallic grains are greater than the traversal width. One of the axes of one metallic grain is a diagonal line of the metallic grain. In an exemplary embodiment, the grain sizes of 90% or more of the metallic grains measured at the bottom of the damascene structure 820 are greater than the traversal width. In some embodiments, about 90% or more of the metal line is formed as a bamboo structure. In an exemplary embodiment, 99% of the metal line is formed as a bamboo structure.

In an exemplary embodiment, the interconnect is made of Cu. The metal line 830 comprises copper of about 99% or more by atomic ratio. About 80% or more of the metal line is formed as (111) orientation with a texture intensity. The metallic grains grown in (111) orientation have excellent conductive quality. For the texture intensity of the sputtered-Cu formed as (111) orientation, the texture intensity of the sputtered-Cu formed as (111) is about 46~64% stronger than that of Cu deposited by ECP. Generally speaking, an additive concentration of Cu for ECP deposition is from about 20 ppm to about 400 ppm. In an exemplary embodiment, an additive concentration of the metal line is less than 100 ppm. In an exemplary embodiment, an additive concentration of the metal line is equal to or less than 20 ppm. In an exemplary embodiment, an additive concentration of the metal line approaches to zero. In the present disclosure, the implementation of sputtered-Cu not only largely enhances the quality and purity of the metal line but also makes the additive concentration of the metal line be dramatically abated. The sputtered-Cu deposition is superior to the ECP-Cu deposition.

Since most of the Cu metal line is formed as (111) orientation, the Cu metal line has large grain sizes and excellent conductive quality such that low resistance of the Cu metal line is arrived at. The sputtered-Cu deposition has higher purity than that of ECP-Cu deposition. When the gate CD shrinks below N20, especially below N10, ECP-Cu deposition is not able to be formed as a bamboo structure due to its high additive concentration (about 20 ppm to about 400 ppm) and the potential voids formed during the ECP deposition. The sputtered-Cu deposition and reflowed-Cu deposition of the subject disclosure show excellent gap-fill ability and low resistance.

In some embodiments, a method comprises providing a substrate; forming an opening in a dielectric layer disposed on the substrate; providing a target with a first type atoms; ionizing the first type atoms provided from the target; providing a bias to the substrate for controlling the moving paths of the ionized first type atoms thereby directing the ionized first type atoms in the opening; and forming a first conductive structure from bottom of the opening with the ionized first type atoms under a pre-determined frequency and a pre-determined pressure.

In some embodiments, a method comprises: providing a substrate; forming a patterned dielectric layer comprising an opening on the substrate; and depositing a Cu layer in the opening and heating the Cu layer concurrently.

In some embodiments, a semiconductor device comprises: a substrate; a dielectric layer on the substrate; and an interconnect surrounded by the dielectric layer, wherein the interconnect is configured as a trace for electrical current routing, the interconnect comprises a metal line constructed with a metallic grain, and about 80% or more of the metal line is formed as (111) orientation with a texture intensity.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method comprising:
providing a substrate;

forming an opening in a dielectric layer disposed over the substrate;
providing a target with a first type atoms;
ionizing the first type atoms provided from the target;
providing a bias to the substrate for controlling moving paths of the ionized first type atoms thereby directing the ionized first type atoms in the opening for deposition;
forming a first conductive structure from bottom of the opening by a sputtering deposition with the ionized first type atoms under a pre-determined frequency from about 30 MHz to about 70 MHz and a pre-determined pressure from about 50 mTorr to about 100 mTorr;
filling the opening with the ionized first type atoms by a sputtering deposition under the pre-determined frequency and the pre-determined pressure to form a second conductive structure; and
performing a chemical-mechanical-polishing (CMP) operation after filling the opening to remove a portion of the second conductive structure and a portion of the dielectric layer to form an interconnect;
wherein the interconnect is constructed with metallic grains; and the interconnect extends along a direction Y with a traversal width extends along a direction X perpendicular to the direction Y; and about 90% or more of the metallic grains have a grain size greater than the traversal width.

2. The method of claim 1, wherein the first type atoms is Cu or noble metal.

3. The method of claim 1, wherein more than about 80% of the first type atoms provided from the target are ionized.

4. A method comprising:
providing a substrate;
forming an opening in a dielectric layer disposed over the substrate;
ionizing atoms provided from a target to generate ionized atoms;
providing a bias to the substrate to control moving paths of the ionized atoms;
bottom-up depositing a first conductive structure in the opening with the ionized atoms;
trimming an overhang in the first conductive structure;
depositing a second conductive structure over the first conductive structure with the ionized atoms by a sputtering deposition under a pre-determined frequency from about 30 MHz to about 70 MHz and a pre-determined pressure from about 50 mTorr to about 100 mTorr;
depositing a third conductive structure over the second conductive structure by an electrochemical plating (ECP) deposition; and
performing a chemical-mechanical-polishing (CMP) operation to remove a portion of the third conductive structure and a portion of the dielectric layer to form an interconnect;
wherein the interconnect is constructed with metallic grains; and the interconnect extends along a direction Y with a traversal width extends along a direction X perpendicular to the direction Y; and about 90% or more of the metallic grains have a grain size greater than the traversal width.

5. The method of claim 4, wherein the forming the opening in the dielectric layer disposed over the substrate comprises:
forming a via by performing a first set of photolithography and etching operations.

6. The method of claim 5, wherein the forming the opening in the dielectric layer disposed over the substrate comprises:
forming a trench by performing a second set of photolithography and etching operations.

7. The method of claim 4, wherein the bias is from about 0 V to about 300 V.

8. The method of claim 4, wherein the method is applied to a 20 nm semiconductor process or a semiconductor process below 20 nm.

9. The method of claim 4, wherein the first conductive structure has a thickness from about 200 angstroms (A) to 600 A.

10. The method of claim 4, wherein the trimming an overhang in the first conductive structure comprises:
performing a plasma treatment on the first conductive structure.

11. A method comprising:
providing a substrate;
forming an opening in a dielectric layer disposed over the substrate;
providing atoms ionized form a target;
providing a bias to the substrate to control moving paths of the ionized atoms;
providing an ionizer between the target and the substrate to affect magnetic field and ion flux of the ionized atoms;
bottom-up depositing a first conductive structure in the opening with the ionized atoms;
trimming overhangs in the first conductive structure;
depositing a second conductive structure over the first conductive structure with the ionized atoms by a sputtering deposition under a pre-determined frequency from about 30 MHz to about 70 MHz and a pre-determined pressure from about 50 mTorr to about 100 mTorr;
depositing a third conductive structure over the second conductive structure by a sputtering deposition under the pre-determined frequency and the pre-determined pressure; and
performing a chemical-mechanical-polishing operation at least on the third conductive structure to form an interconnect;
wherein the interconnect is constructed with metallic grains; and the interconnect extends along a direction Y with a traversal width extends along a direction X perpendicular to the direction Y; and about 90% or more of the metallic grains have a grain size greater than the traversal width.

12. The method of claim 3, wherein more than about 99% of the first type atoms provided from the target are ionized.

13. The method of claim 1, wherein the bias is from about 0 V to about 300 V.

14. The method of claim 1, wherein the method is applied to a 20 nm semiconductor process or a semiconductor process below 20 nm.

15. The method of claim 4, wherein the atoms provided from the target are Cu.

16. The method of claim 4, wherein more than about 80% of the atoms provided from the target are ionized.

17. The method of claim 11, wherein the trimming the overhangs in the first conductive structure comprises:
performing a plasma treatment on the first conductive structure.

18. The method of claim 11, wherein the bias is from about 0 V to about 300 V.

19. The method of claim 11, wherein the method is applied to a 20 nm semiconductor process or a semiconductor process below 20 nm.

20. The method of claim 11, wherein the atoms ionized from the target are Cu.

\* \* \* \* \*